United States Patent
Wang et al.

(10) Patent No.: US 8,390,005 B2
(45) Date of Patent: Mar. 5, 2013

(54) APPARATUS AND METHOD FOR NANOWIRE OPTICAL EMISSION

(75) Inventors: Shih-Yuan Wang, Palo Alto, CA (US); Nobuhiko Kobayashi, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 638 days.

(21) Appl. No.: 12/243,105

(22) Filed: Oct. 1, 2008

(65) Prior Publication Data
US 2009/0321782 A1    Dec. 31, 2009

Related U.S. Application Data

(60) Provisional application No. 61/077,076, filed on Jun. 30, 2008.

(51) Int. Cl.
*H01L 33/00* (2010.01)

(52) U.S. Cl. ............... 257/94; 257/9; 257/24; 257/784; 257/E21.09

(58) Field of Classification Search .............. 257/9, 94, 257/24, 784, E21.09
See application file for complete search history.

(56) References Cited

U.S. PATENT DOCUMENTS

| | | | | |
|---|---|---|---|---|
| 6,647,048 B2 * | 11/2003 | Evans | ............... | 372/50.11 |
| 7,521,274 B2 * | 4/2009 | Hersee et al. | ............... | 438/41 |
| 7,629,532 B2 * | 12/2009 | Kim et al. | ............... | 136/255 |
| 2003/0089899 A1 * | 5/2003 | Lieber et al. | ............... | 257/9 |
| 2005/0133476 A1 * | 6/2005 | Islam et al. | ............... | 216/2 |
| 2007/0238211 A1 | 10/2007 | Wang et al. | | |
| 2007/0267625 A1 | 11/2007 | Wang et al. | | |
| 2008/0001161 A1 | 1/2008 | Kobayashi et al. | | |

FOREIGN PATENT DOCUMENTS

| | | |
|---|---|---|
| WO | 02080280 A1 | 10/2002 |
| WO | 03005450 A2 | 1/2003 |

* cited by examiner

*Primary Examiner* — Kenneth Parker
*Assistant Examiner* — Dale E Page

(57) ABSTRACT

An optical emitter includes at least one nanowire connected in a circuit such that current selectively flows into the nanowire. The nanowire has a length-to-diameter ratio of ten or less. A method for generating optical emission includes applying a voltage across a nanowire to inject charge carriers into the nanowire, the nanowire having a length-to-diameter ratio of ten or less; and confining the charge carriers within the nanowire by placing a high bandgap material at each end of the nanowire, wherein the charge carriers recombine to emit optical energy.

13 Claims, 8 Drawing Sheets

APPARATUS AND METHOD FOR NANOWIRE OPTICAL EMISSION

CROSS-REFERENCE TO RELATED APPLICATION

The present application claims priority from provisional application Ser. No. 61/077,076, filed Jun. 30, 2008, the contents of which are incorporated herein by reference in their entirety.

BACKGROUND

Semiconductor light sources, such as light emitting diodes (LEDs) and laser diodes (LDs) are widely used in today's electronic technologies. Semiconductor light sources are used in a range of applications including digital communications, machine vision, medical devices, and other applications. Because of their efficient use of energy, semiconductor light sources are becoming more widely used in house lighting, computer screens, and even street lights. As optical technology improves, optics may take over many of the processing and communication tasks performed conventionally with electrical signals.

Consequently, further developments in the structure and function of semiconductor light sources are potentially of significant value. For example, the use of nanowires in lasers and LEDs may lead to greatly improved devices. A nanowire is an elongated structure, like a wire, with a diameter on the order of a nanometer. Nanowires are also known as quantum wires. There are at least two major challenges in the development of nanowire lasers and LEDs. These challenges include the extracting of heat from a nanowire and matching the bandgap of the material in the nanowire with host materials.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
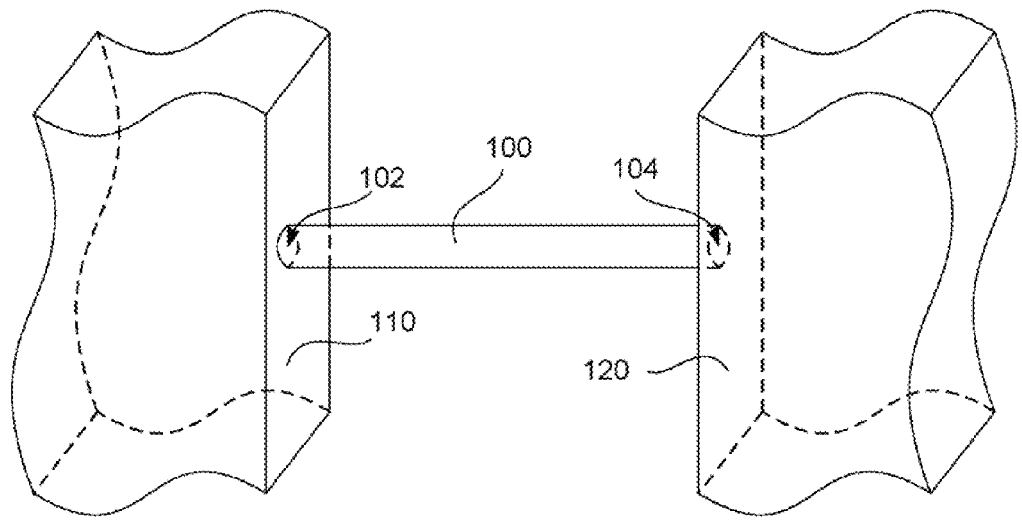
FIG. 1A is an illustrative diagram of a long nanowire interposed between two walls, according to one embodiment of the principles described herein.

The following specification describes devices and techniques for using nanowires in semiconductor light sources and related system. Particularly, the present specification addresses the dissipation of heat and bandgap matching in nanowire-based semiconductor light sources.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used in the present specification and in the appended claims, the term "optical energy" refers to radiated energy having a wavelength generally between 10 nanometers and 500 microns. Optical energy as thus defined includes, but is not limited to, ultraviolet, visible, and infrared light. Optical energy also may be referred to herein as an optical photon, or simply a photon.

An "optical emitter" will refer generally to any device that generates or emits optical energy, as here defined. The figures of the present specification illustrate various examples and embodiments of optical emitters.

As mentioned above, extracting heat from a nanowire can be very difficult. In a nanowire laser or LED, a voltage difference is applied across the nanowire, resulting in current flow. This flow of current generates heat in the nanowire. If that heat is not sufficiently dissipated, the temperature of the nanowire can rise to excessive levels. In some cases, where heat is not sufficiently dissipated, the excessive temperature of the nanowire can cause it to light up like the filament of an incandescent light bulb. Nanowires operating at excessive temperatures can result in poor radiation efficiency, current leakage, and damage to the nanowire and surrounding materials.

The total amount of heat generated on a nanowire for a given amount of current is approximately proportional to the length of the wire and inversely proportional to its diameter. The rate at which heat is extracted is approximately proportional to the cross sectional area of the wire, assuming the wires are attached at the ends to a material that serves as a heat sink and heat travels toward the heat sink. This is because most heat, at least at normal operating temperatures, is dissipated through the portions of the wire that are in contact with the rest of the device. However, if not enough heat is dissipated, the heat may increase in the nanowire to a point where heat will be released as radiant energy, as previously mentioned.

FIG. 1A shows a long nanowire (100) spanning a gap as may be found in an exemplary nanowire laser configuration. Only aspects of the configuration as they affect heat dissipation will be discussed in relation to this figure. The term "long nanowire" is used to refer to a nanowire with a length that is greater than ten times its diameter. The nanowire (100) having a first end (102) and a second end (104) spans a gap between a first wall (110) and a second wall (120). The first end (102) is in thermal communication with the first wall (110), and the second end (104) is in thermal communication with the second wall (120).

During laser operation, a current is induced across the nanowire (100) by application of a voltage difference between the first and second walls (110, 120). This flow of current generates heat along the length of the nanowire (100) due to the electrical resistance of the nanowire. Because very little heat from the nanowire (100) is dissipated into the air, at least at lower temperatures, most of the heat is dissipated through the first and second ends (102, 104) of the nanowire. However, because of the large length-to-diameter ratio of the nanowire (100) a large amount of heat is generated compared to the small amount of surface area through which heat may be dissipated. For this reason heat cannot be dissipated sufficiently and the nanowire (100) may get too hot for efficient operation of a laser or LED.

The length-to-diameter ratios of nanowires are generally very large, for example on the order of tens, hundreds, or thousands. Therefore, such nanowires often generate a large amount of heat with a very small area through which the heat may be conducted. Uncharacteristically short nanowires, for example with length-to-diameter ratios less than or equal to ten, can produce much less total heat compared to their longer counterparts. By sufficiently limiting the length of the nanowire with respect to the cross sectional area of the wire, this heat can be dissipated keeping the wire at a safe and efficient operating temperature.

Figure 1B:
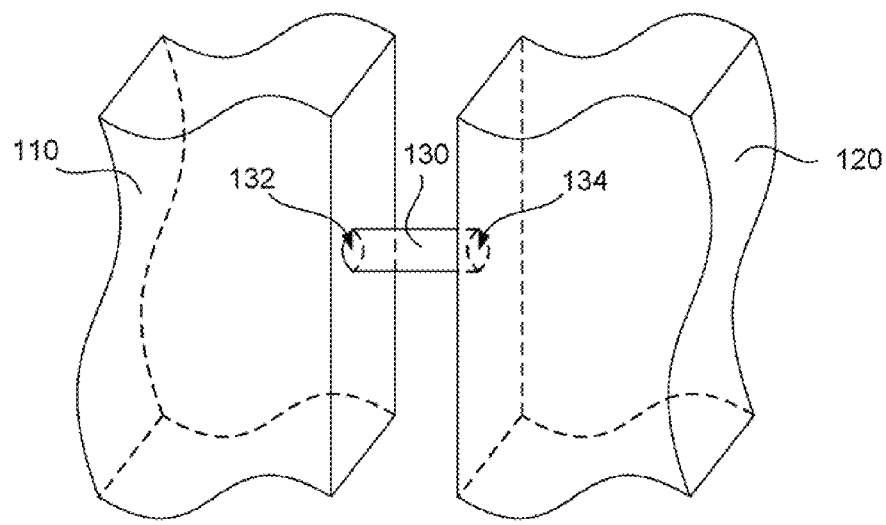
FIG. 1B is an illustrative diagram of a short nanowire interposed between two walls, according to one embodiment of the principles described herein.

In FIG. 1B a short nanowire (130), with a length-to-width ratio of ten or less, is shown spanning a gap between a first wall (110) and a second wall (120). The nanowire (130) has a first end (132) and a second end (134). The diameter of the short nanowire (130) is equal to the diameter of the previously mentioned long nanowire (100 FIG. 1A) but is much shorter.

Again, current is induced in the nanowire by application of a voltage difference across the first and second walls (110, 120). Heat is generated along the length of the nanowire (130) and dissipated through the ends (132, 134). Because the nanowire (130) is the same diameter with a shorter length, less total heat is generated as compared to the long nanowire of FIG. 1A. However, the same amount of surface area is in contact with the walls (110, 120) for heat dissipation. Therefore, with the same current flow across the nanowire (130), the short nanowire (130) will be kept at a lower temperature. As would be apparent to one skilled in the art, the length-to-diameter ratio can be reduced by shortening the wire, increasing the diameter of the wire, or both. The creation of nanowires with a length-to-diameter ratio of ten or less is suggested to prevent the nanowire from heating up excessively. In at least some particular embodiments, the nanowires have a length-to-diameter ratio of about three.

The second challenge mentioned previously is matching the bandgap of the material in a nanowire to the host material. The term bandgap refers to the energy difference between the valence and conduction bands of semiconductor materials between which are forbidden energy states. These bands represent energy states that may be occupied by charge carriers (electrons and holes). Bandgap influences the electrical properties of a semiconductor such as the frequency of optical emission or absorption, noise levels, and temperature behavior. When one or more semiconductor materials are bonded to each other, the relative bandgaps influence where free carriers are more likely to accumulate. For example, free carriers near a junction between two semiconductor materials are likely to move to, or stay in, the material with the smaller bandgap. This is because charge carriers are more likely to occupy lower energy states than higher energy states.

According to one exemplary embodiment the first and second walls (110, 120) may be made of p-type and n-type semiconductor materials, respectively. With the application of a voltage across the walls (110, 120), the p-type wall with a higher voltage potential than the n-type wall, both electrons and holes are injected onto the nanowire. This type of voltage bias, where a higher voltage potential is applied to the p-type material than the n-type material, is referred to as a forward bias. Emission of optical energy occurs when electrons and holes recombine on the nanowire. For optimal optical emission, the majority of the free charge carriers (electrons and holes) should be confined to the nanowire. To confine charge carriers to the nanowire, its bandgap should be less than or equal to the material through which current is injected and extracted from the wire, such as the walls (110, 120).

However, the materials from which different features of a nanowire laser or LED are made can vary greatly. Many semiconductors that have desirable electrical properties for use in lasers and LEDs come from a subset of semiconductors called III-V compound semiconductors. These compounds are made from combinations of elements in Group III and Group V as listed in the periodic table of the elements. By way of example and not limitation, III-V semiconductors include aluminum arsenide, gallium arsenide, aluminum gallium arsenide, gallium phosphide, indium phosphide, indium gallium arsenide phosphide, gallium nitride, indium gallium nitride, indium nitride and others. One of the benefits of these materials is that many of them have relatively wide bandgaps. This makes them suitable for the emission of a wide range of optical frequencies and also reduces noise and improves efficiency.

In semiconductor devices, manufacturing usually begins with a substrate material. The substrate serves as a structural support upon which various device features may be formed by etching the substrate, growing or depositing materials on the substrate, and/or doping portions of the device to change electrical properties. The most common material used as a substrate is silicon, but other materials may also be used. As a result of its wide use, a silicon substrate has many benefits including well known processing techniques, existing infrastructure, and wider availability. Additionally, logic circuits are generally formed on silicon due to the ability to make needed logic components. By way of example and not limitation, other substrate materials may include germanium (Ge), gallium arsenide (GaAs), and many other members of the III-V and II-VI semiconductor material families.

Often, device features may be formed from semiconductor materials which are different from the substrate. This occurs when a material other than that from which the substrate is made can perform better for a particular purpose than can the substrate material. For example, the nanowire may be made of a different material than the host material, or substrate, to which it is attached. In some cases, the material in the nanowire has a smaller bandgap than the host material. This leads to carrier confinement as desired.

However, in many cases, the desired nanowire material has a larger bandgap than the host material. If the nanowire is built directly onto the host material, poor carrier injection and confinement can be an undesirable result, particularly in light emitting semiconductor devices.

For example, it may be desirable to build a nanowire laser on a silicon substrate. There are many materials with a wider bandgap than silicon that would be desirable for use in the nanowire. A wide bandgap (also called a "high bandgap") refers to a material that has a relatively large energy difference between the conduction and valance bands. Electrons that jump from the high energy conduction band to the valence band shed their excess energy by emitting a photon. The characteristics of the photon, such as the wavelength and frequency, are determined by the bandgap between the conduction band and the valence band.

For example, integrating III-V semiconductors onto silicon allows a high quality light source to be fabricated on silicon photonic circuits. Methods have been created to grow or deposit these materials onto silicon. However, because of their larger bandgap, it may be difficult to effectively inject and confine carriers to a III-V nanowire grown on silicon.

Figure 2A:
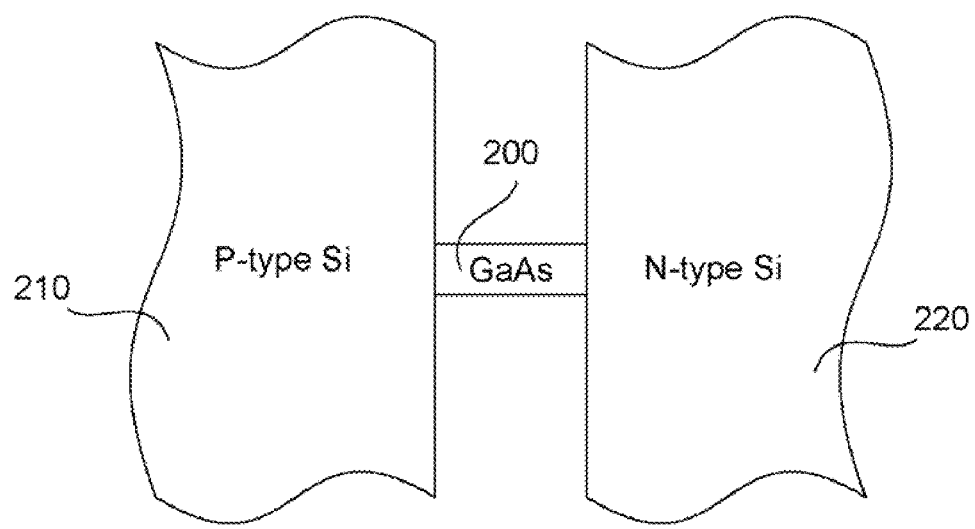
FIG. 2A is an illustrative diagram of a nanowire interposed between two walls, according to one embodiment of the principles described herein.
Figure 2B:
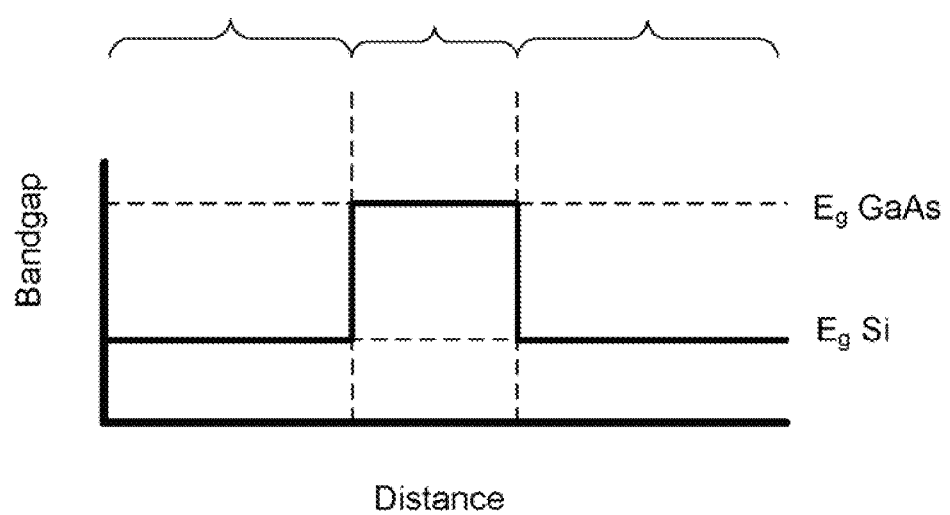
FIG. 2B is an illustrative graph of bandgap across a nanowire junction according to one embodiment of the principles described herein.

FIGS. 2A and 2B illustrate the importance of bandgap matching as previously discussed. FIG. 2A shows a nanowire (200) extending from a first wall (210) to a second wall (220). In one exemplary embodiment, the nanowire (200) is made of a III-V semiconductor material, such as gallium arsenide (GaAs), and the first and second walls (210, 220) are made of p-type silicon and n-type silicon, respectively.

FIG. 2B is an illustrative graph of bandgap verses the distance traveled from the first wall (210, FIG. 2A) across a gallium arsenide (GaAs) nanowire (200, FIG. 2A) to the second wall (200, FIG. 2A). The vertical axis represents increasing bandgap value in an upward vertical direction. Starting in the first wall (210 FIG. 2A) at the left, the bandgap value begins at that of silicon ($E_g$ Si). Moving to the right, the bandgap increases as we move from silicon to the nanowire made of gallium arsenide (GaAs) semiconductor. As we move through the nanowire and back to silicon, the bandgap decrease once more to that of silicon.

If a current is induced across the nanowire (200, FIG. 2A), charge carriers (electrons and holes) are unlikely to stay long enough on the nanowire to recombine. They will quickly move across the nanowire (200, FIG. 2A) to the lower bandgap material of silicon. Since the recombination of an electron with a hole is the process by which light is emitted, it will be very difficult to achieve proper laser or LED operation.

To increase the likelihood that charge carriers will remain longer on the nanowire, a material with a bandgap larger than the material in the nanowire may be placed between the nanowire and silicon of the support walls (210, 220, FIG. 2A). The charge carriers will then be more likely to spend enough time on the nanowire to recombine. This will lead to better laser and LED operation. There are various materials and structures which can be formed to meet these requirements.

According to one exemplary embodiment, microcrystalline silicon may be grown on the silicon support wall (210, 220, FIG. 2A) and then a nanowire can be grown directly on the microcrystalline silicon (μc-Si). Microcrystalline silicon is made of tiny grains of crystalline silicon with amorphous silicon in between. The crystal grain dimensions are on the order of micrometers to nanometers. By varying its composition, for example by varying the hydrogen content and temperature at which the microcrystalline silicon is grown, the bandgap of the microcrystalline silicon can be varied from 1.12 electron volts (eV) to 2.3 eV. According to one exemplary embodiment, the microcrystalline silicon bandgap can be adjusted enough to exceed the bandgap of some III-V semiconductor materials. Therefore, by growing a layer of microcrystalline silicon on a silicon substrate and then growing a III-V semiconductor nanowire on top of it, proper bandgap matching may be achieved.

Figure 3A:
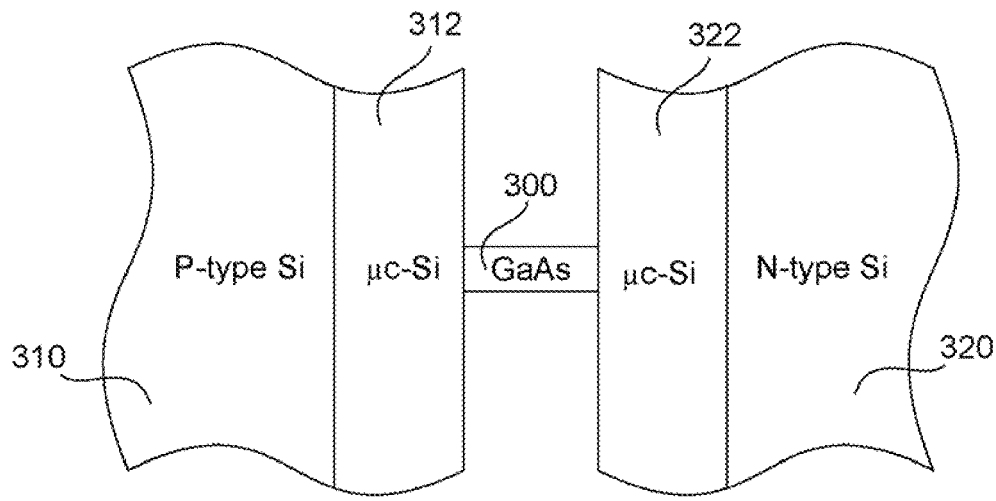
FIG. 3A is an illustrative diagram of a nanowire interposed between two walls with coating layers, according to one embodiment of the principles described herein.

FIG. 3A shows a nanowire (300) extending from a first layer (312) on a first wall (310) to a second layer (322) on a second wall (322). In one exemplary embodiment, the nanowire (300) is made of a III-V semiconductor material, such as gallium arsenide (GaAs) and the first and second walls (310, 320) are made of p-type silicon and n-type silicon, respectively. The first and second layers (312, 322) may be made of microcrystalline silicon, the composition of which results in a bandgap greater than that of the material used in the nanowire (300). The nanowire (300) may be made of a single material or multiple materials.

Figure 3B:
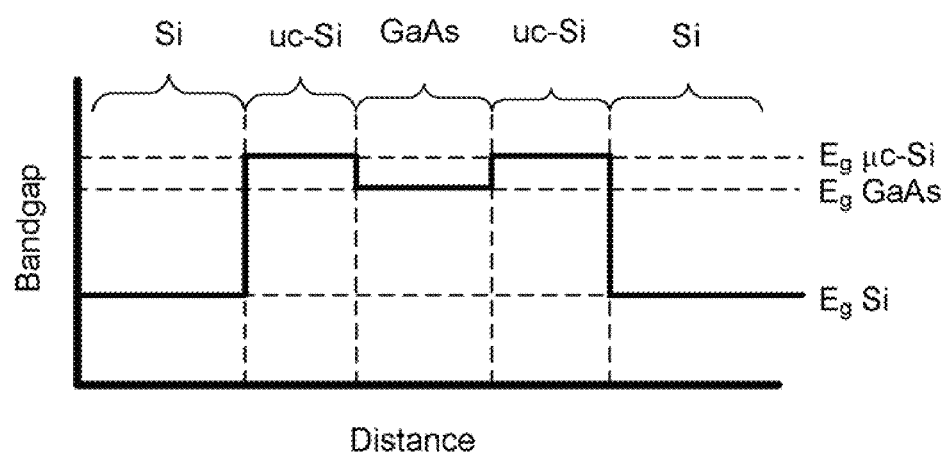
FIG. 3B is an illustrative graph of bandgap across a nanowire junction, according to one embodiment of principles described herein.

In one embodiment, the nanowire (300) is made of a single material, such as gallium arsenide (GaAs). FIG. 3B is an illustrative graph of bandgap verses the distance traveled from the first wall (310) through the microcrystalline silicon layers (312, 322) and gallium arsenide (GaAs) nanowire (300), and into the second wall (320). The vertical axis represents increasing bandgap value in an upward vertical direction. Starting at the left in the first wall (310, FIG. 3A) the bandgap value begins at that of silicon ($E_g$ Si). Moving to the right, and into the first layer (312, FIG. 3A) of microcrystalline silicon, the bandgap jumps to the bandgap value of microcrystalline silicon. In the nanowire, the bandgap drops to the bandgap level of gallium arsenide ($E_g$ GaAs). After exiting the nanowire onto the second layer (322, FIG. 3A), the bandgap jumps again to the bandgap value of microcrystalline silicon ($E_g$ μc-Si) and then drops to the bandgap of silicon ($E_g$ Si) in the second wall (320, FIG. 3A).

If a current is induced across the nanowire (300, FIG. 3A), free carriers are now likely to stay long enough in the nanowire to recombine and produce photon emissions. Due to the bandgap peaks on either side, it is more difficult for free carriers to move back to the silicon walls. As a result, charge carriers will be better confined to the nanowire (300, FIG. 3A), and more optical energy will be emitted.

The use of microcrystalline silicon between the nanowire and the supporting silicon walls has many benefits. A very important benefit is the ability to form a high quality laser on a silicon substrate. Because of silicon's widespread use as a substrate, it may be much cheaper. Additionally, using a silicon substrate allows for optical light sources to be incorporated into silicon photonic circuits.

Figure 4A:
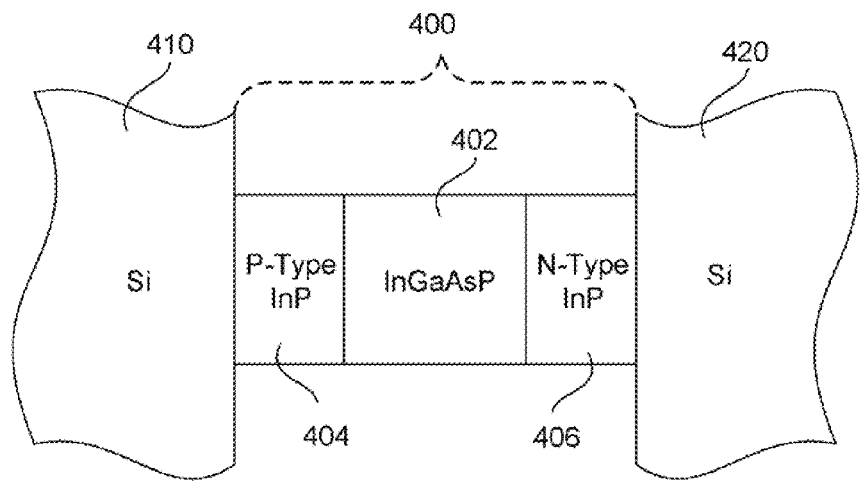
FIG. 4A is an illustrative diagram of a heterojunction nanowire interposed between two walls, according to one embodiment of the principles described herein.

In an alternate embodiment, a nanowire may be made of more than one material. Nanowires made of more than one material are often referred to as heterojunction nanowires. FIG. 4A shows a heterojunction nanowire (400) between two silicon walls (410, 420). The nanowire (400) comprises a first end (404) made of p-type indium phosphide, a middle section (402) made of indium gallium arsenide phosphide, and a second end (406) made of n-type indium phosphide. Other configurations are also possible, such as incorporating quantum wells in the narrow bandgap section.

Figure 4B:
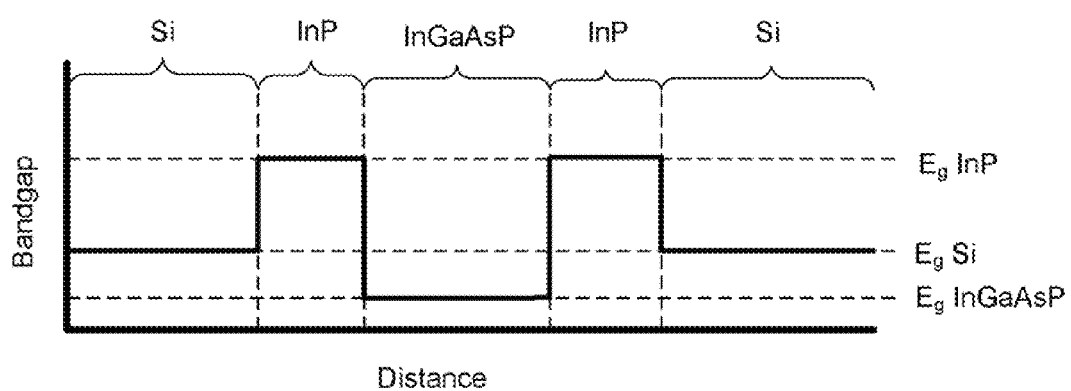
FIG. 4B is an illustrative graph of bandgap across a nanowire junction, according to one embodiment of principles described herein.

FIG. 4B is an illustrative graph of bandgap verses the distance traveled from the first wall (410 FIG. 4A), through the layers (410, 420) and heterojunction nanowire (400), and into the second wall (420, FIG. 4A). The vertical axis represents increasing bandgap value in an upward vertical direction. Starting at the left in the first wall (410, FIG. 4A), the bandgap value begins at that of silicon ($E_g$ Si). Moving into the first end (404) of the nanowire, the bandgap jumps to the bandgap value of indium phosphide ($E_g$ InP). Then, in the middle section (402) of the nanowire, the bandgap drops again to the bandgap value of indium gallium arsenide phosphide ($E_g$ InGaAsP) before jumping back up to the bandgap value of indium phosphide in the second end (406) of the nanowire. After exiting the nanowire and into the second watt (420, FIG. 4A), the bandgap drops to that of silicon ($E_g$ Si).

Note that the bandgap of indium gallium arsenide phosphide ($E_g$ InGaAsP) is less than that of silicon ($E_g$ Si). Because indium gallium arsenide phosphide has a smaller bandgap than silicon, this embodiment has the benefit that the silicon substrate will be transparent to the light emitted from the nanowire. This enables the emission of light in any desired direction, including through silicon walls and/or through a silicon substrate. Further, no layer is required between the silicon walls (410, 420) and the nanowire (400) because the wide bandgap of indium phosphide helps confine charge carriers to the middle section (402) of the nanowire.

Figure 5:
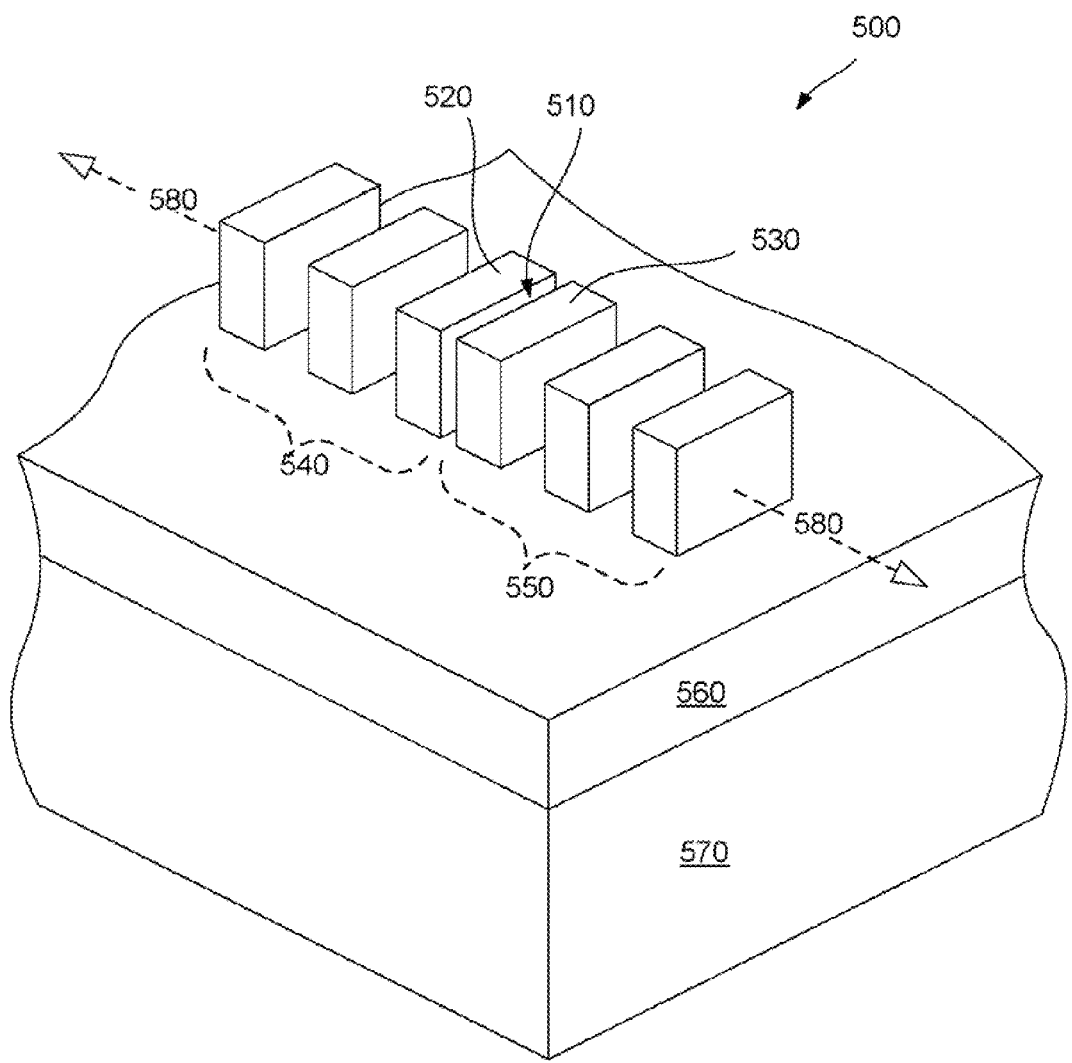
FIG. 5 is an illustrative perspective diagram of one nanowire laser structure, according to principles described herein.

Referring now to FIG. 5, an illustrative nanowire laser structure (500) is shown. The laser structure (500) comprises a trench (510) formed between a first wait (520) and a second wait (530). Within the trench (510) are one or more nanowires (not shown) where photon emission can occur. There is a first set of distributed Bragg reflectors (540) of which the first wall (520) is a part and a second set of distributed Bragg reflectors (550) of which the second wall (530) is a part. That is, the walls (520, 530) are used to form the trench and they are also a layer in the distributed Bragg reflectors (540, 550).

A distributed Bragg reflector (DSR) is a structure formed from multiple layers of alternating materials with varying refractive indices, or by periodic variation of some characteristic, such as height. This results in the periodic variation in the effective refractive index through which the optical wave travels. Each layer boundary causes a partial reflection of an optical wave. The sum total of the reflections off multiple boundaries can result in a very high total reflectivity. Very high reflectivities are often necessary for proper laser or LED operation.

According to one exemplary embodiment, these Bragg reflectors (540, 550) are parallel to the length of the trench (510). In this embodiment, the reflectors (540, 550), including the trench walls (520, 530), have been formed on an electrically insulating layer (560) that has been grown on top of a substrate (570).

Figure 6:
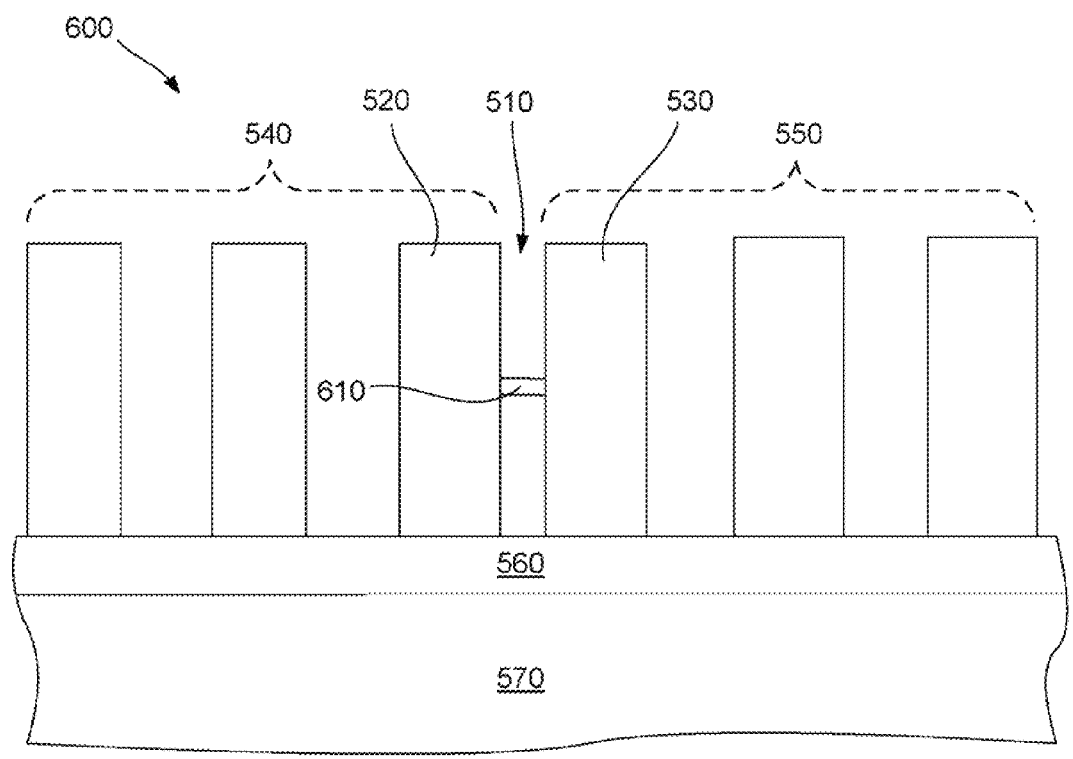
FIG. 6 is an illustrative diagram of a cross-sectional view of the nanowire laser structure depicted in FIG. 5, according to principles described herein.

FIG. 6 shows an exemplary cross sectional view (600) of the laser structure (500) shown in FIG. 5, with the point of view taken parallel to the length of the trench (510). To the left of the trench (510) is the first set of Bragg reflectors (540), which includes the first wall (520). To the right is the second set of Bragg reflectors (550), which includes the second wall (530). The reflectors (540, 550) are formed on an insulating layer (560) which has been formed on the substrate (570). In one embodiment, the insulating layer (560) is made of silicon dioxide ($SiO_2$) which has been grown on a silicon substrate (570).

According to one illustrative embodiment, the Bragg reflectors (540, 550), of which the first and second wall (520, 530) are a part, are made of silicon. The reflectors (540, 550) are periodically spaced. This configuration of reflectors is sometime referred to as air-semiconductor reflectors. Other configurations are also possible, such as semiconductor-semiconductor reflectors which are known to those skilled in the art. According to one illustrative embodiment, the nanowire (610) is a heterojunction nanowire similar to that described in relation to FIG. 4A and is composed of materials such that the energy of emitted photons is less than the bandgap of silicon so that silicon is transparent to the laser light. The wavelength may be 1550 nm for example.

The spacing of the reflectors (540, 550) depends on the desired emission frequency of the laser. Based on the spacing, certain frequencies can be selectively reflected or transmitted. For example, the reflectors are often spaced at ¼ of the desired emission wavelength. This results in a reflector that can have a very high reflectivity for the desired optical frequency and much lower reflectivity for other frequencies. If the III-V compound semiconductor materials used in the nanowires (610) emit a certain wavelength of light when stimulated, the spacing of the reflectors (540, 550) may be configured to match accordingly.

The width of the trench (510) and the dimensions of the nanowire (510) are such that the length-to-diameter ratio of the nanowire (610) is ten or less. In at least one embodiment, the nanowires have length-to-diameter ratios of about 3. These dimensions allow for sufficient heat dissipation through the ends of the nanowire (610) and into the walls (520, 530) to keep the nanowire in an efficient operating temperature range. A typical nanowire diameter used in this configuration may be 60 nanometers. However, this diameter can range, for example, from the low tens of nanometers to the many hundreds of nanometers. The length can then be chosen according to the length-to-diameter ratios as previously discussed.

According to one illustrative embodiment, the laser structure (600) is operated by the application of a forward bias to the first and second walls (520, 530). This forward bias induces a flow of charge carriers (holes from the p-type side of the nanowire and electrons from the n-type side of the nanowire) onto the midsection of the nanowire (410).

In the midsection of the nanowire (610), some of these electrons and holes recombine. Because of the material properties of the nanowire (510), this recombination results in the emission of photons, or units of optical energy. A portion of these photons are reflected by the Bragg reflectors (540, 550) back into the nanowire (610). These reflected photons stimulate the emission of additional photons. The stimulated photons have the same phase and direction as that of the stimulating photon or photons. Again, the reflectors (540, 550), according to their reflectivity, reflect a portion of these stimulated photons back into the nanowire.

This process continues until most of the recombination that takes place in the nanowire is stimulated recombination. This generally happens very quickly. This results in a coherent beam of optical energy, meaning that the individual photons have the same phase and direction, reflecting back and forth between the mirrors with a portion of the optical energy escaping (580, FIG. 5). The escaping optical energy is the "laser beam" that can be used for many purposes.

This exemplary nanowire laser structure has many beneficial attributes. Because, according to one exemplary embodiment, there is only one nanowire laser in the trench (510), the dimensions of the waits (520, 530) and reflectors (540, 550) may be in the submicron range. It may be desirable to include one or many of these laser structures on a single chip for optical communication or processing, etc. Also, since the nanowire may be made from a III-V compound semiconductor material, the benefits of these materials may be exploited. These benefits include, but are not limited to a greater range of emitted optical frequencies, high efficiency, and low noise.

Many variations on this structure are possible. For example, a lower or higher frequency of optical radiation may be emitted by using various III-V semiconductor compounds, III-VI semiconductor compounds, or group IV semiconductors in the nanowire (610). The nanowire (610) and trench (510) dimensions could be adjusted, as long as they are such that the nanowire (610) has a length-to-diameter ratio of ten or less for heat dissipation. More than one nanowire may also be included in the trench. Further, the shape of the nanowires may vary greatly. For example, the diameter of the nanowire may vary along its axis or the cross sectional shape may also vary.

Also, the configuration of the Bragg reflectors (540, 550) may be adjusted. For laser operation, their percent reflectivity is usually very high, for example up around 99 percent. However, an LED may be made by reducing the reflectivity to sometimes as low as 60 or 70 percent or lower. By way of example and not by limitation, reflectivity may be adjusted by any combination of the type or quality of the materials used, the number of layers, or reflector spacing.

In another exemplary embodiment, the nanowire (610) could be made of a single material, such as that shown in relation to FIG. 3A, with a layer of microcrystalline silicon on the walls (520, 530).

Figure 7:
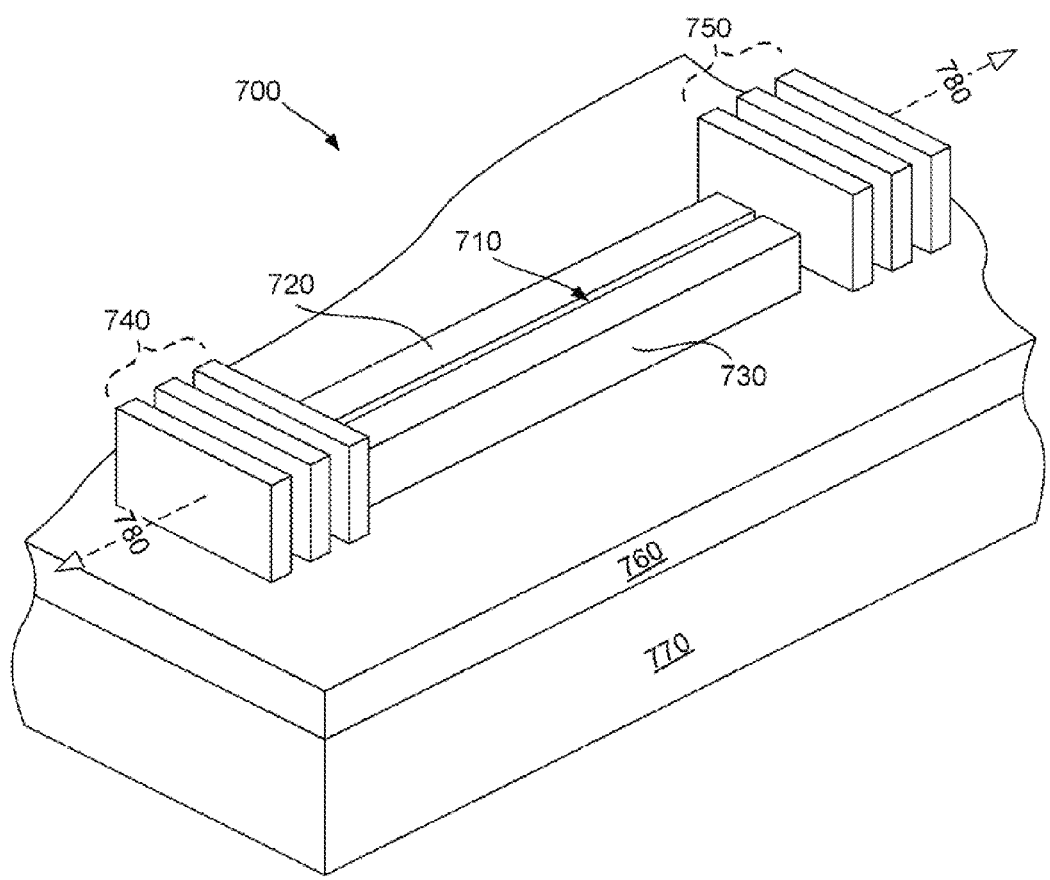
FIG. 7 is an illustrative perspective diagram of one nanowire laser structure, according to principles described herein.

Referring now to FIG. 7, another illustrative nanowire laser structure (700) is shown. The embodiment comprises a trench (710) formed by a first wall (720) and a second wall (730) with a narrow gap between them. Within the trench (710) are one or more nanowires (not shown) where photon emission can occur. At either end of the trench are, respectively, a first set of Bragg reflectors (740) and a second set of or Bragg reflectors (750). In this embodiment, the reflectors (740, 750) and trench walls (720, 730) have been formed on top of an electrically insulating layer (760) that has been grown on top of a substrate (770).

In one exemplary embodiment, the length of the trench (710) can be in the tens of micrometers with a number of nanowires reaching into the hundreds. The Bragg reflectors (740, 750) are at the ends of the trench and perpendicular to its length.

In this laser structure (700), a voltage may be applied across the first and second walls (720, 730) and, therefore, across the nanowires in the trench. This stimulates the emission of optical energy. A large portion of the optical energy is reflected by the reflectors (740, 750) back into the trench (710) and nanowires, which results in stimulated emission of additional optical energy. The portion of the optical energy that is not reflected back into the trench (710) escapes in the directions indicated by the dotted arrows (780). It will be noted that the optical energy is now emitted and reflected parallel to the length of the trench (710) rather than perpendicular to it, as in a previously described embodiment.

Variations on the Bragg reflectors (740, 750) similar to those discussed in relation to FIG. 6 are possible. Further, the Bragg reflectors (740, 750) may be omitted completely, and the resulting design placed in a separately manufactured set of reflectors or a reflective cavity.

Figure 8:
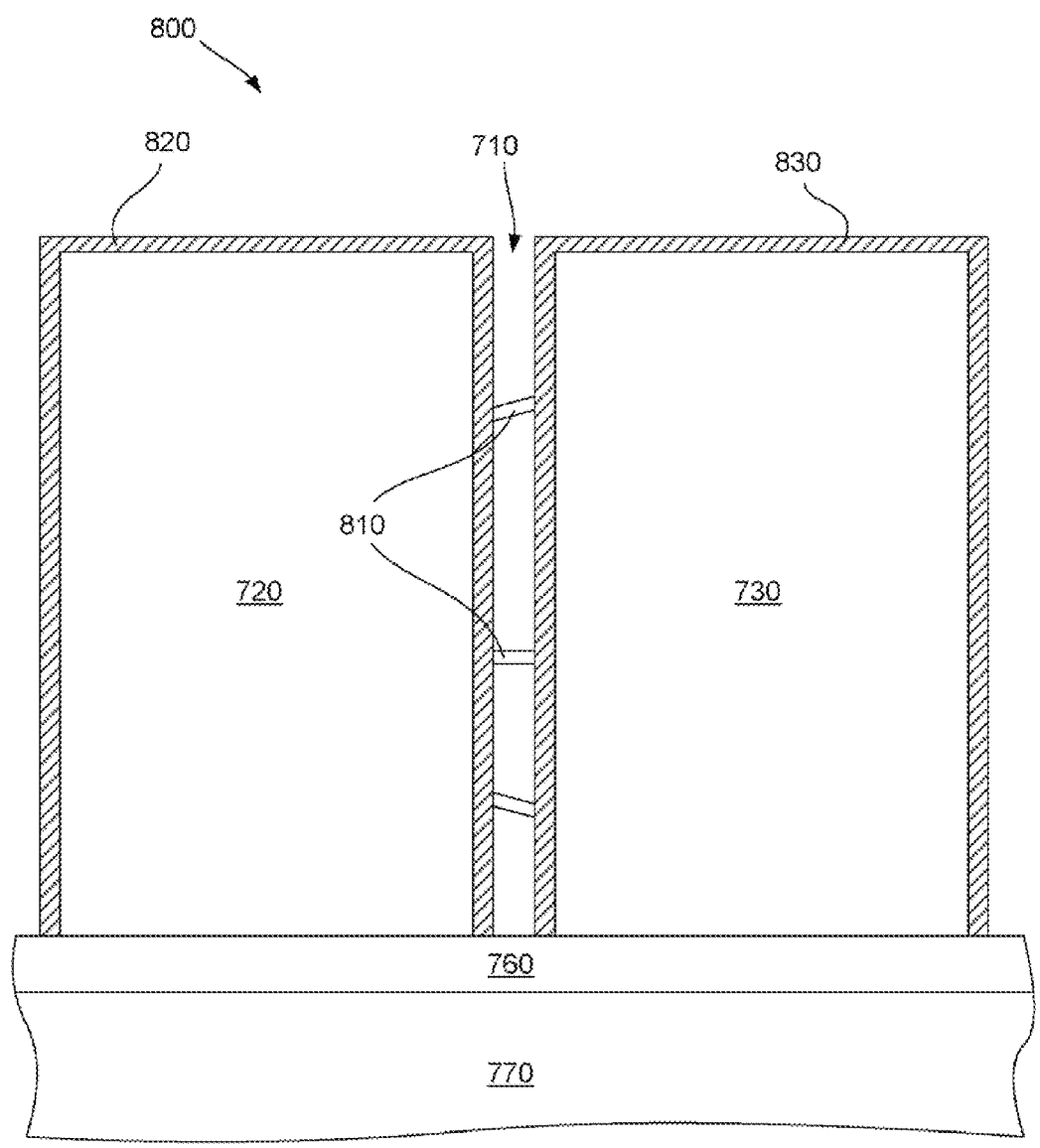
FIG. 8 is an illustrative diagram of a cross-sectional view of the nanowire laser structure depicted in FIG. 7, according to principles described herein.

FIG. 8 is an illustrative cross-sectional view (800) of the exemplary laser trench (710) depicted in FIG. 7. The trench (710) is formed by a first wall (720) to the left, a second wall (730) to the right, and an insulating layer (760) below. The insulating layer (760) is formed on a substrate (770). A first layer (820) covers the first wall (720) and a second layer (830) covers the second wall (730). Within the trench (710), nanowires (810) span the width of the trench from the layer (820) on the first wall (720) on the left to the layer (830) on the second wall (730) on the right.

According to one exemplary embodiment, the first wall (720) is made of p-type silicon and the second wall (730) is made of n-type silicon. The substrate (770) may be made of intrinsic or doped silicon. The layers (820, 830) may be made of microcrystalline silicon having such a composition that their bandgap is higher than the bandgap of the material used in the nanowires (810). This helps confine free charge carriers to the nanowire. Further, the electrically insulating layer (760) may be made of silicon dioxide (SiO$_2$) that has been formed on a silicon substrate (770) to electrically isolate the first wall (720) from the second wall (730).

According to one exemplary embodiment, the nanowires (810) are made of a III-V compound semiconductor material such as a member of the indium phosphide (InP) family. The nanowires (810) may be made of a single material or they may be heterojunction nanowires as previously discussed. The specific compound(s) chosen for the nanowires (810) may depend in part on the desired frequency of optical emission. The number of nanowires (810) in the trench (710) may vary depending on the desired emission properties of the laser. In general, more nanowires (810) will lead to a higher power laser and fewer nanowires (810) will result in a lower power laser.

Again, the width of the trench (710) and the dimensions of the nanowires (810) are such that the length-to-diameter ratio of the nanowires is less than or equal to ten.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An optical emitter comprising:
a trench in a semiconductor substrate, said trench forming a first wall and a second wall; and
at least one nanowire extending between said walls and connected in a circuit such that current selectively flows into said nanowire to produce emitted photons;
a layer of microcrystalline silicon grown on said first and second walls of said trench as an interface between said nanowire and said semiconductor substrate;
wherein said at least one nanowire has a length-to-diameter ratio of ten or less; and
wherein said nanowire is formed of a primary material having a bandgap less than a bandgap of said interface between said nanowire and said semiconductor substrate.

2. The optical emitter of claim 1, wherein said at least one nanowire has a length-to-diameter ratio of about 3.

3. The optical emitter of claim 1, wherein said at least one nanowire is a heterojunction nanowire.

4. The optical emitter of claim 1, wherein one or more of said nanowires are made of one or more Group III-V compound semiconductor materials.

5. The optical emitter of claim 1, further comprising reflectors for reflecting a portion of photons emitted from said at least one nanowire back into the nanowire.

6. The optical emitter of claim 1, in which a portion of the nanowire comprises a local bandgap minima such that holes and electrons tend to remain in said portion of said nanowire.

7. The optical emitter of claim 5, in which the nanowire comprises a bandgap smaller than said substrate, said substrate being transparent to photons emitted by said nanowire.

8. The optical emitter of claim 7, further comprising a first Bragg reflector disposed on a first side of said trench and a second Bragg reflector being disposed on an opposite side of said trench, said first and second Bragg reflectors being substantially parallel to the length of the trench, such that at least a portion of photons transmitted through said substrate are reflected back into said substrate.

9. The optical emitter of claim 5, further comprising a first Bragg reflector disposed on a first side of said trench and a second Bragg reflector being disposed on an opposite side of said trench, said first and second Bragg reflectors being substantially perpendicular to the length of the trench, such that at least a portion of photons emitted by said nanowire are reflected back down said trench to said nanowire and stimulating emission of photons having a same phase and direction as reflected photons.

10. The optical emitter of claim 1, in which the first wall comprises a p-type semiconductor and the second wall is a n-type semiconductor, said current being induced by a forward voltage bias between said first wall and said second wall.

11. The optical emitter of claim 3, in which at least one nanowire comprises a narrow bandgap section comprising quantum wells.

12. The optical emitter of claim 3, in which said heterojunction nanowire comprises a low bandgap material sandwiched between a first high bandgap material and a second high bandgap material.

13. An optical emitter comprising:
   a trench in a semiconductor substrate, said trench forming a first wall and a second wall; and
   at least one nanowire extending between said walls and connected in a circuit such that current selectively flows into said nanowire to produce emitted photons;
   wherein said nanowire is formed of a primary material having a bandgap less than a bandgap of a microcrystalline silicon interface between said nanowire and said semiconductor substrate.

* * * * *